United States Patent
He et al.

(10) Patent No.: US 8,608,495 B2
(45) Date of Patent: Dec. 17, 2013

(54) POWER SUPPLY APPARATUS

(75) Inventors: Yu-Wei He, Shenzhen (CN); Wen-Da Zhang, Shenzhen (CN)

(73) Assignees: Hong Fu Jin Precision Industry (ShenZhen) Co., Ltd., Shenzhen (CN); Hon Hai Precision Industry Co., Ltd., New Taipei (TW)

( * ) Notice: Subject to any disclaimer, the term of this patent is extended or adjusted under 35 U.S.C. 154(b) by 34 days.

(21) Appl. No.: 13/531,375

(22) Filed: Jun. 22, 2012

(65) Prior Publication Data
US 2013/0078837 A1 Mar. 28, 2013

(30) Foreign Application Priority Data

Sep. 26, 2011 (CN) .......................... 2011 1 0288040

(51) Int. Cl.
*H01R 4/60* (2006.01)
(52) U.S. Cl.
USPC .......................................................... 439/212
(58) Field of Classification Search
USPC ......... 439/212, 213, 114, 639, 952; 174/71 B
See application file for complete search history.

(56) References Cited

U.S. PATENT DOCUMENTS

| | | | | |
|---|---|---|---|---|
| 6,024,589 A | * | 2/2000 | Hahn et al. | 439/212 |
| 8,456,807 B2 | * | 6/2013 | Tallam et al. | 361/637 |

* cited by examiner

*Primary Examiner* — Hae Moon Hyeon
(74) *Attorney, Agent, or Firm* — Altis Law Group, Inc.

(57) ABSTRACT

A power supply includes first connecting board, a second connecting board and a conductive module. Three adapters are located on the first connecting board. The three adapters connect with power supply via three anodes and three cathodes. A connector is located on the second connecting board and configured to output power. The conductive module includes a first bus bar and a second bus bar. The first bus bar includes three input terminals and an output terminal. The second bus bard includes three input terminals and an output terminal The three input terminals of the first bus bar are electrically connected to the three anodes of the three adapters. The three input terminals of the second bus bar are electrically connected to the three cathodes of the three adapters. The output terminals of the first bus bar and the second bus bar are electrically connected to the second connecting board.

20 Claims, 4 Drawing Sheets

POWER SUPPLY APPARATUS

BACKGROUND

1. Technical Field

The present disclosure relates to power supply apparatuses, and particularly to a power supply apparatus with a simple structure.

2. Description of Related Art

A power supply apparatus may provide power for each electronic device in servers via an individual power supply cables. Therefore, each of the electronic devices has to be equipped with a transformer and a rectification. The individual transformer and the individual rectification complicate structures of the servers. Having complicated structures inside the servers is not only hard to manage, but also inconvenient to maintain and influence heat dissipation from such a system.

Therefore, there is room for improvement within the art.

BRIEF DESCRIPTION OF THE DRAWINGS

Many aspects of the embodiments can be better understood with reference to the following drawings. The components in the drawings are not necessarily drawn to scale, the emphasis instead being placed upon clearly illustrating the principles of the embodiments. Moreover, in the drawings, like reference numerals designate corresponding parts throughout the several views.

DETAILED DESCRIPTION

The disclosure is illustrated by way of example and not by way of limitation in the figures of the accompanying drawings in which like references indicate similar elements. It should be noted that references to "an" or "one" embodiment in this disclosure are not necessarily to the same embodiment, and such references mean "at least one."

Figure 1:
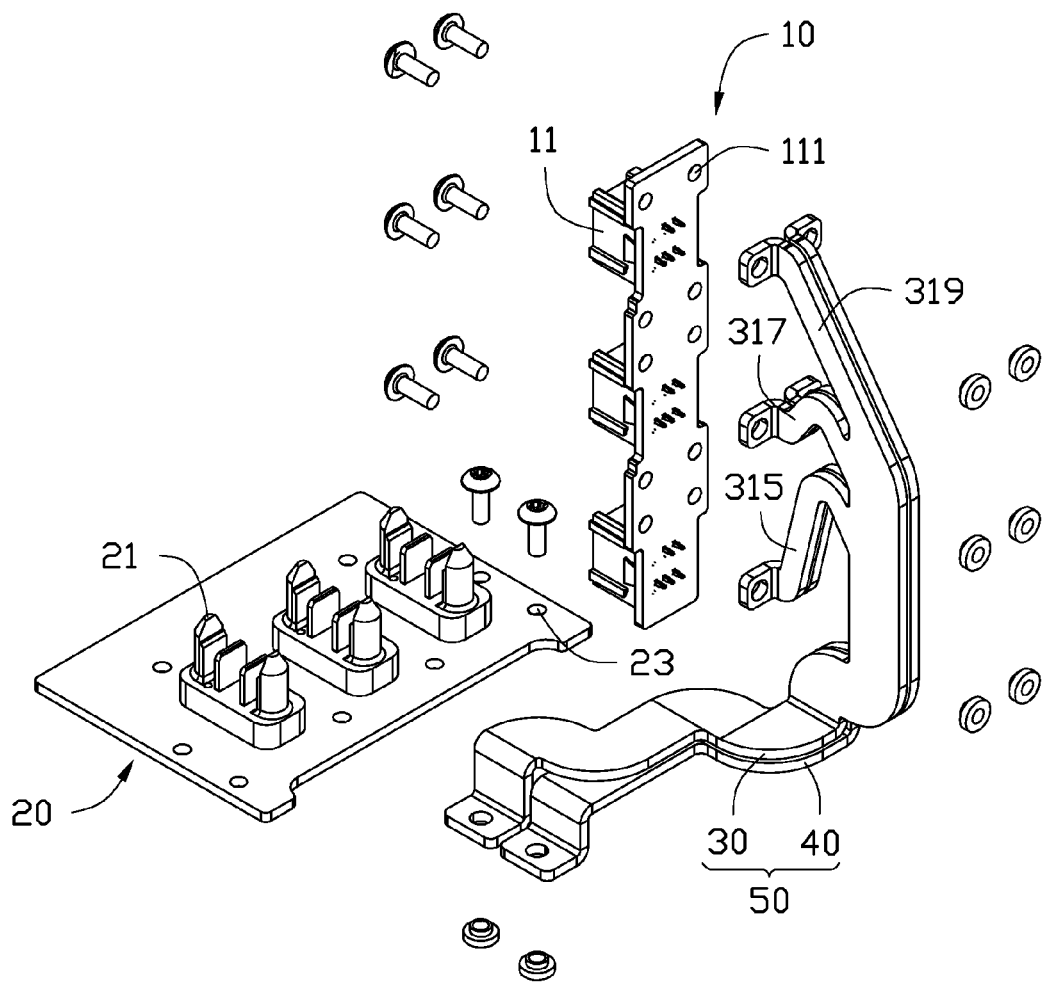
FIG. 1 is an exploded, isometric view of an embodiment of a power supply apparatus.

Referring to FIG. 1, a power supply apparatus includes a first connecting board 10, a second connecting board 20, and a conductive module 50. The second connecting board 20 can provide power for electronic devices, such as audio cards or video cards.

Three adapters 11, parallel to each other, are located on the first connecting board 10. Each of the three adapters 11 is electronically connected to three power supplies (not shown). Each of the three adapters 11 has an anode and a cathode. Three pairs of through holes 111 are defined in the first connecting board 10. Each of the three pairs of through holes 111 is adjacent to one of the three adapters 11.

Three connectors 21 are located on the second connecting board 20. The second connecting board 20 defines two fixing holes 23 on the back of the three connectors 21.

The conductive module 50 includes a first bus bar 30 and a second bus bar 40 attached to the first bus bar 30. The first bus bar 30 and the second bus bar 40 are insulated from each other. The first bus bar 30 and the second bus bar 40 are separately secured to the first connecting board 11.

Figure 3:
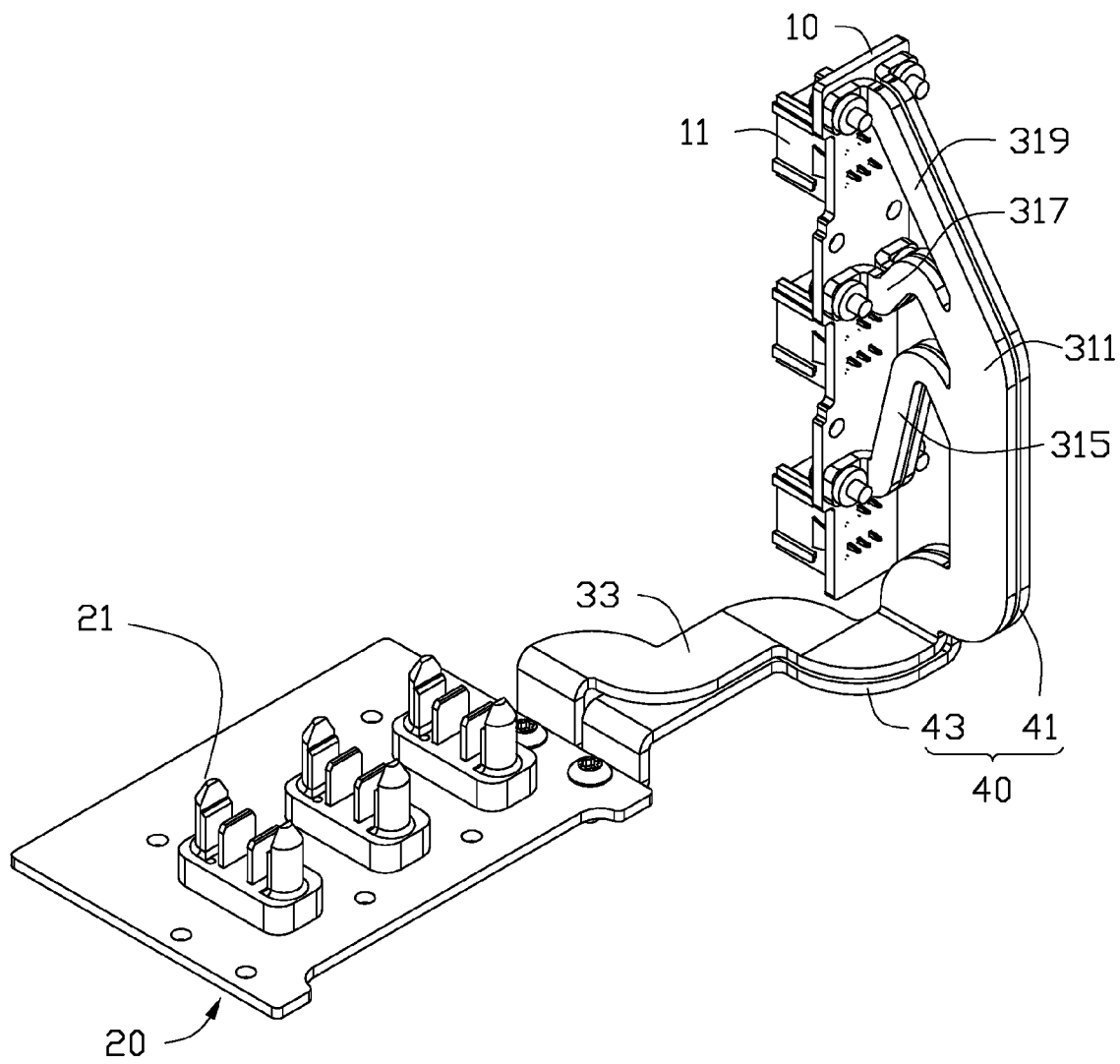
FIG. 3 is an assembled view of the power supply apparatus of FIG. 1.
Figure 4:
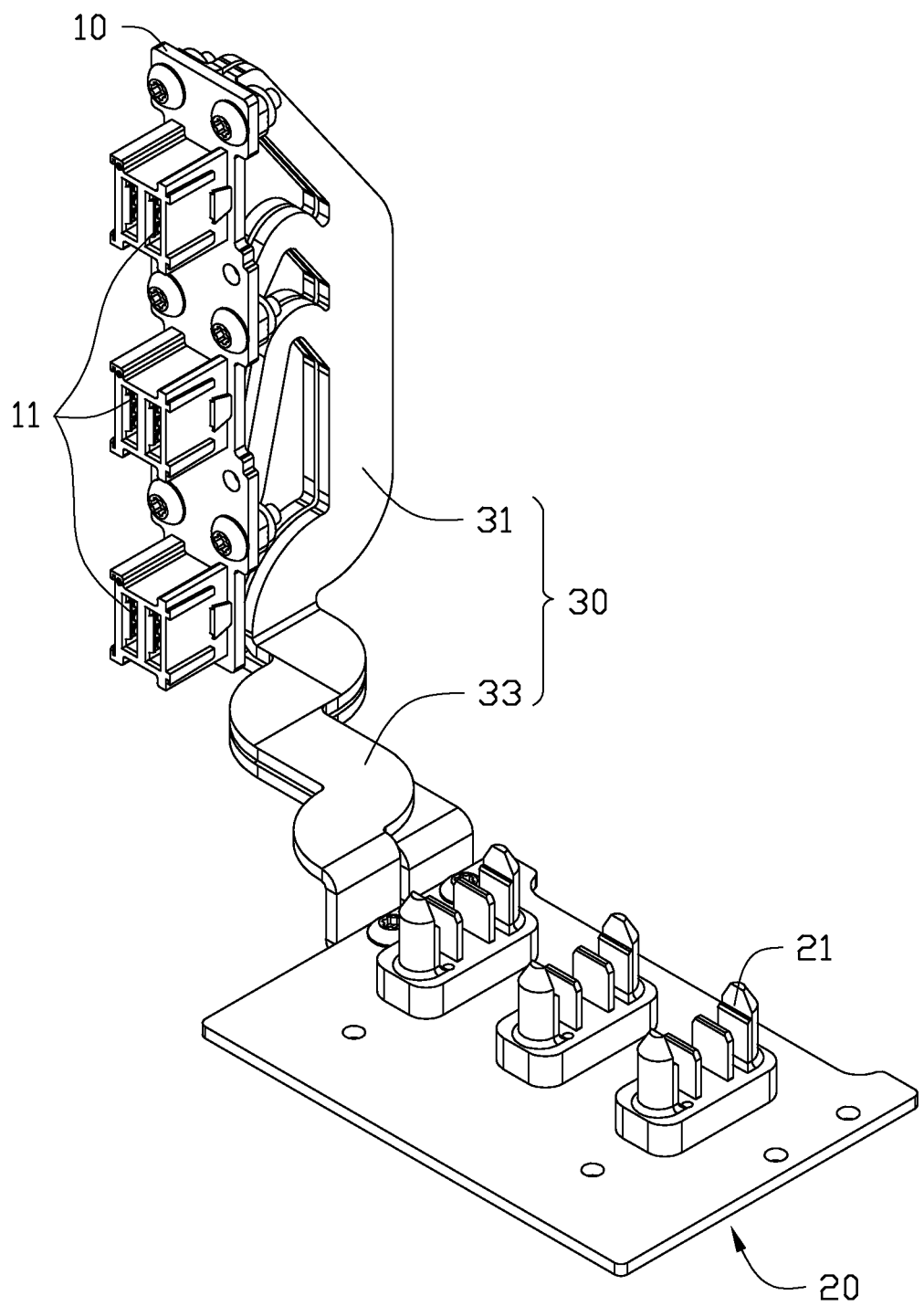
FIG. 4 is similar to FIG. 3, but viewed from a different aspect.

Referring to FIGS. 3-4, the first bus bar 30 includes a first conductive portion 31 and a second conductive portion 33 connected to the first conductive portion 31. The second bus bar 40 includes a third conductive portion 41 and a fourth conductive portion 43. In one embodiment, the first conductive portion 31 and the third conductive portion 41 have the same configuration.

Figure 2:
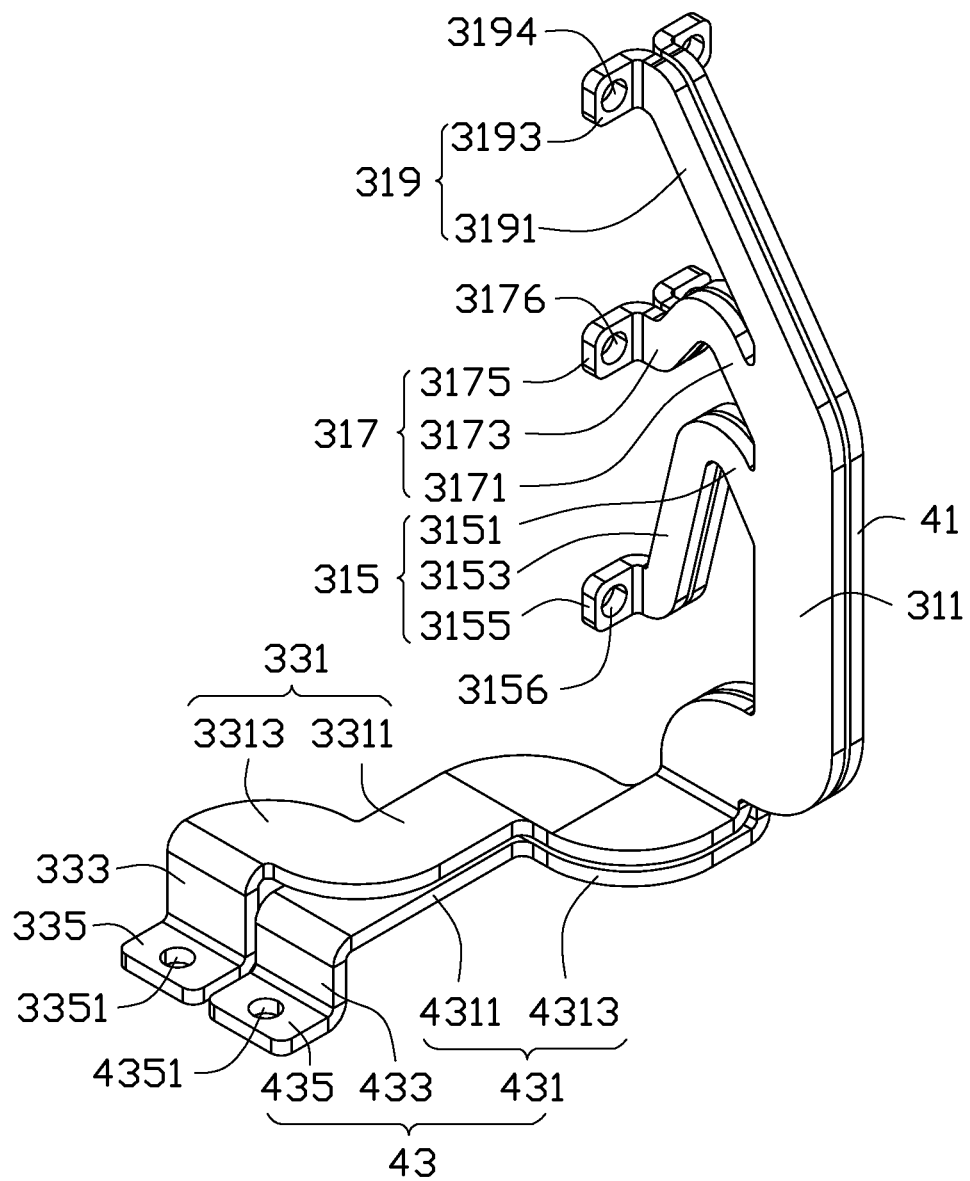
FIG. 2 is an exploded view of a conductive module of FIG. 1.

Referring to FIG. 2, each of the first conductive portion 31 and the third conductive portion 41 includes a main body 311, a first branch 315, a second branch 317, and a third branch 319. The first branch 315 includes a first extending portion 3151, a first linking portion 3153 and a first input terminal 3155. The first extending portion 3151 extends from the main body 311. The linking portion 3153 reversely extends from a distal end of the extending portion 3151. The first input terminal 3155 extends from a distal end of the first linking portion 3153 and defines a first securing hole 3156.

The second branch 317 includes a second extending portion 3171, a second linking portion 3173, and a second input terminal 3175. The second extending portion 3173 extends from the main body 311. The second linking portion 3173 reversely extends from a distal end of the second extending portion 3171. The second input terminal 3175 extends from a distal end of the linking portion 3173 and defines a second securing hole 3176.

The third branch 319 includes a third extending portion 3191 and a third input terminal 3193. The third extending portion 3191 extends from the main body 311. The third input terminal 3193 extends from a distal end of the linking portion 3191 and defines a third securing hole 3194. In one embodiment, the first branch 315, the second branch 317 and the third branch 319 all have the same electrical resistance.

The first input terminal 3155, the second input terminal 3175 and the third input terminal 3193 of the first conductive portion 31 are respectively connected to the three anodes (or electrodes) of three adapters 11. The first input terminal 3155, the second input terminal 3175 and the third input terminal 3193 of the third conductive portion 41 are respectively connected to the three electrodes (or cathodes) of three adapters 11.

Referring to FIG. 3, the second conductive portion 33 includes a first transforming portion 331, a first connecting portion 333 and a first output terminal 335. In one embodiment, the first transforming portion 331 is connected substantially perpendicularly to the main body 311 of the first conductive portion 31. The first transforming portion 331 includes a first curve portion 3311 and a second curve portion 3313. The first connecting portion 333 extends from a distal end of the second curved portion 3313. In one embodiment, the first connecting portion 333 is substantially perpendicular to the first transforming portion 331. The first output terminal 335 extends from a distal end of the first connecting portion 333.

The fourth conductive portion 43 includes a second transforming portion 431, a second connecting portion 433 and a second output terminal 435. The second transforming portion 431 includes a third curve portion 4311 and a fourth curve portion 4313. The second connecting portion 433 extends from a distal end of the fourth curved portion 4313. In one embodiment, the second connecting portion 433 is substantially perpendicular to the second transforming portion 431. The second output terminal 435 extends from a distal end of the second connecting portion 433.

Referring to FIGS. 3 and 4, in assembly, the conductive module 50 is located between the first connecting board 10 and the second connecting board 20. Each of the first securing hole 3156, the second securing hole 3176 and the third securing hole 3194 of the first bus bar 30 and the second bus bar 40 is aligned with one of the three pairs of through holes 111. Fasteners, such as screws, are screwed into the first securing hole 3156, the second securing hole 3176, the third securing hole 3194 and the three pairs of the through holes 111. The first input terminal 3155, the second input terminal 3175, and the third input terminal 3193 are respectively connected electrically to the three anodes of the three adapters 11. The first input terminal 3155, the second input terminal 3175, and the third input terminal 3193 of the second bus bar 40 are respectively connected electrically to the three cathodes of the three adapters 11. Each of the first installation hole 3351 and the second installation hole 4351 is aligned with one of the two fixing holes 23. Fasteners, such as screws, are screwed into the first installation hole 3351, the second installation hole 4351, and the two fixing holes 23. The first output terminal 335 and the second output terminal 435 are electrically connected to the second connecting board 20.

In use, the power supplies provide the three adapters 11 with electrical power. The three adapters 11 input the power via the three anodes and the three cathodes to the conductive module 50. The conductive module 50 outputs the power to the second connecting board 20. The second connecting board 20 outputs the power to the electronics via the connectors 21.

It is to be understood, however, that even though numerous characteristics and advantages have been set forth in the foregoing description of embodiments, together with details of the structures and functions of the embodiments, the disclosure is illustrative only and changes may be made in detail, especially in the matters of shape, size, and arrangement of parts within the principles of the disclosure to the full extent indicated by the broad general meaning of the terms in which the appended claims are expressed.

What is claimed is:

1. A power supply apparatus comprising:
   a first connecting board;
   three adapters located on the first connecting board, each of the three adapters electrically connectable to a power supply and comprising an anode and a cathode;
   a second connecting board electrically connectable to three electronic devices;
   a connector located on the second connecting board and configured to output power for the three electronic devices; and
   a conductive module comprising a first bus bar and a second bus bar attached to the first bus bar, the first bus bar comprising three input terminals and an output terminal, the second bus bar comprising three input terminals and an output terminal;
   wherein the three input terminals of the first bus bar are respectively electrically connected to the three anodes of the three adapters, the three input terminals of the second bus bar are respectively electrically connected to the three cathodes of the three adapters, and the output terminals of the first bus bar and the second bus bar are electronically connected to the second connecting board.

2. The power supply apparatus of claim 1, wherein first bus bar comprises a first conductive portion and a second conductive portion connected to the first conductive portion, the first conductive portion comprises a main body, a first branch, a second branch and a third branch, and the first branch, the second branch, and the third branch extend from the main body.

3. The power supply apparatus of claim 2, wherein the second conductive portion is substantially perpendicularly connected to the first conductive portion.

4. The power supply apparatus of claim 2, wherein the three input terminals of the first bus bar comprises a first input terminal extending from the first branch, a second input terminal extending from the second branch, and a third input terminal extending from the third branch, and the first input terminal, the second input terminal and the third input terminal are respectively electrically connected to the three anodes.

5. The power supply apparatus of claim 4, wherein the first branch comprises a first extending portion and a first linking portion, the first extending portion extends from the main body, the first linking portion extends from the first extending portion, and the first input terminal is located on a distal end of the first linking portion.

6. The power supply apparatus of claim 4, wherein the second branch comprises a second extending portion and a second linking portion, the second extending portion extends from the main body, the second linking portion extends from the second extending portion, and the second input terminal is located on a distal end of the second linking portion.

7. The power supply apparatus of claim 4, wherein the third branch comprises a third extending portion extending from the main body, and the third input terminal is located on a distal end of the third extending portion.

8. The power supply apparatus of claim 2, wherein the second conductive portion comprises a first transforming portion, and the transforming portion is electrically connected to the main body of the first conductive portion.

9. The power supply apparatus of claim 8, wherein the second conductive portion further comprises a first connecting portion connected substantially perpendicularly to the first transforming portion, and the output terminal of the first bus bar is located on a distal end of the first connecting portion.

10. The power supply apparatus of claim 2, wherein the second bus bar comprises a third conductive portion and a fourth conductive portion connected substantially perpendicularly to the third conductive portion.

11. The power supply apparatus of claim 10, wherein the third conductive portion and the first conductive portion are symmetrical, the fourth conductive portion comprises a second transforming portion and a second connecting portion, the second transforming portion is connected substantially perpendicularly to the third conductive portion, and the output terminal of the second bus bar is located on a distal end of the second connecting portion.

12. A power supply apparatus comprising:
   a first connecting board, three adapters located on the first connecting board, the three adapters adaptor to be electrically connected to three power supplies, and each of the three adapters comprising an and a cathode;
   a second connecting board adapted to be electrically connected to three electronic devices and output power for the three electronic devices; and
   a conductive module, the conductive module comprising a first bus bar and a second bus bar, the first bus bar comprising three input terminals and an output terminal, the second bus bar comprising three input terminals and an output terminal;
   wherein the three input terminals of the first bus bar are electrically connected to the three anodes of the three adapters, the three input terminals of the second bus bar are electrically connected to the three cathodes of the three adapters, and the output terminals of the first bus bar and the second bus bar are electrically connected to the second connecting board.

13. The power supply apparatus of claim 12, wherein the first bus bar comprises a first conductive portion and a second conductive portion, and the first conductive portion comprises a main body, a first branch, a second branch and a third branch, and the first branch, the second branch and the third branch separately extend from the main body.

14. The power supply apparatus of claim 13, wherein the second conductive portion is connected substantially perpendicularly to the first conductive portion.

15. The power supply apparatus of claim 14, wherein the three input terminals of the first bus bar comprises a first input terminal extending from a first branch, a second input terminal extending from a second branch, and a third input terminal extending from a third branch, and the first input terminal, the second input terminal and the third input terminal are respectively electrically connected to the three anodes.

16. The power supply apparatus of claim 15, wherein the first branch comprises a first extending portion and a first linking portion, the first extending portion extends from the main body, the first linking portion extends from the first extending portion, and the first input terminal is located on a distal end of the first linking portion.

17. The power supply apparatus of claim 15, wherein the second branch comprises a second extending portion and a second linking portion, the second extending portion extends from the main body, the second linking portion extends from the second extending portion, and the second input terminal is located on a distal end of the second linking portion.

18. The power supply apparatus of claim 15, wherein the third branch comprises a third extending portion extending from the main body, and the third input terminal is located on a distal end of the third extending portion.

19. The power supply apparatus of claim 13, wherein the second conductive portion comprises a first transforming portion and a first connecting portion connected to the first transforming portion, the transforming portion is electrically connected to the main body, and the output terminal of the first bus bar is located on a distal end of the first connecting portion.

20. The power supply apparatus of claim 19, wherein the second bus bar and the first bus bar have the same configuration.

* * * * *